United States Patent
Feng et al.

(10) Patent No.: US 10,768,457 B2
(45) Date of Patent: Sep. 8, 2020

(54) METHOD FOR MANUFACTURING DISPLAY SCREEN, DISPLAY SCREEN AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiang Feng, Beijing (CN); Zhaokun Yang, Beijing (CN); Qiang Zhang, Beijing (CN); Sha Liu, Beijing (CN); Xiao Sun, Beijing (CN); Yanqing Chen, Beijing (CN); Yun Qiu, Beijing (CN); Ruizhi Yang, Beijing (CN); Tao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 67 days.

(21) Appl. No.: 15/987,033

(22) Filed: May 23, 2018

(65) Prior Publication Data
US 2019/0033650 A1    Jan. 31, 2019

(30) Foreign Application Priority Data

Jul. 31, 2017  (CN) .......................... 2017 1 0643635

(51) Int. Cl.
*G02F 1/1333*  (2006.01)
*G02F 1/1341*  (2006.01)
(Continued)

(52) U.S. Cl.
CPC ...... *G02F 1/133305* (2013.01); *G02F 1/1341* (2013.01); *G02F 1/133514* (2013.01);
(Continued)

(58) Field of Classification Search
CPC ............ G02F 1/133305; G02F 1/1339; G02F 1/1341; G02F 1/133514; G02F 2001/13354; G02F 2201/56; H01L 27/1214
(Continued)

(56) References Cited

U.S. PATENT DOCUMENTS

| 6,066,018 A * | 5/2000 | Grupp ............... G02F 1/133351 |
| | | 445/25 |
| 2013/0202869 A1* | 8/2013 | Cho ........................... C08J 7/06 |
| | | 428/220 |
| 2016/0054511 A1 | 2/2016 | Zhang et al. |

FOREIGN PATENT DOCUMENTS

| CN | 103676276 A | 3/2014 |
| CN | 106019742 A | 10/2016 |

(Continued)

OTHER PUBLICATIONS

First Office Action from Chinese Patent Application No. 201710643635.7 dated Sep. 18, 2018.

*Primary Examiner* — Nathanael R Briggs
*Assistant Examiner* — William D Peterson
(74) *Attorney, Agent, or Firm* — Calfee, Halter & Griswold LLP

(57) ABSTRACT

A method for manufacturing a display screen, including: preparing a first substrate and reserving at least one first hole region on the first substrate; preparing a second substrate and reserving at least one second hole region on the second substrate; adding liquid crystals onto the first substrate or the second substrate and aligning the first substrate with the second substrate such that the first hole region is aligned with the second hole region; and forming a hole penetrating the first substrate and the second substrate through the first
(Continued)

hole region and the second hole region. The liquid crystals do not occupy the first hole region and the second hole region.

5 Claims, 10 Drawing Sheets

(51) Int. Cl.
     *G02F 1/1335*     (2006.01)
     *H01L 27/12*     (2006.01)
     *G02F 1/1339*     (2006.01)

(52) U.S. Cl.
     CPC ........ *H01L 27/1214* (2013.01); *G02F 1/1339* (2013.01); *G02F 2001/133354* (2013.01); *G02F 2201/56* (2013.01)

(58) Field of Classification Search
     USPC .......................................................... 349/158
     See application file for complete search history.

(56) References Cited

FOREIGN PATENT DOCUMENTS

| | | |
|---|---|---|
| CN | 106444167 A | 2/2017 |
| JP | 10241751 A | 9/1998 |

\* cited by examiner

METHOD FOR MANUFACTURING DISPLAY SCREEN, DISPLAY SCREEN AND DISPLAY DEVICE

CROSS REFERENCE TO RELATED APPLICATIONS

The present application claims the priority benefits of the patent application No. 201710643635.7 filed to the Patent Office of China on Jul. 31, 2017, the disclosure of which is incorporated herein by reference.

TECHNICAL FIELD

This disclosure relates to the technical field of display screens, and in particular to a method for manufacturing a display screen, a display screen and a display device.

BACKGROUND

Display screens comprise both flexible screens and rigid screens. An example of flexible screens is a LCD flexible screen. An example of rigid screens is a screen used in mobile terminals. Due to functional needs of an electronic product, a display panel of the electronic product usually requires holes to be formed therein. For example, a hole for exposing a camera is required in a non-display region of a mobile terminal. Furthermore, a receiver hole corresponding to the position of a receiver may also be required in the vicinity of a display region of the mobile terminal. Accordingly, it may be necessary to bore holes in the screen if an electronic product with full-screen display is to be manufactured. For both flexible screens and rigid screens, it is difficult to bore holes, especially micro-holes. Accuracy and reliability of the boring can be difficult.

SUMMARY

An embodiment of this disclosure provides a method for manufacturing a display screen, comprising steps of: preparing a first substrate and reserving at least one first hole region on the first substrate; preparing a second substrate and reserving at least one second hole region on the second substrate; adding liquid crystals onto the first substrate or the second substrate and aligning the first substrate with the second substrate such that the first hole region is aligned with the second hole region, the liquid crystals do not occupy the first hole region and the second hole region; and forming a hole penetrating the first substrate and the second substrate through the first hole region and the second hole region.

In some embodiments, the display screen is a flexible screen, and the step of preparing a first substrate and reserving at least one first hole region on the first substrate comprises: providing a first glass carrier; reserving the at least one first hole region on the first glass carrier; fabricating a first hole definition layer on the first glass carrier, the first hole definition layer overlaying the first hole region; fabricating the first substrate on the first glass carrier, the first substrate surrounds the first hole definition layer, and a thickness of the first substrate is no greater than that of the first hole definition layer, and the first substrate comprises a thin film transistor array.

In some embodiments, the step of preparing a second substrate and reserving at least one second hole region on the second substrate comprises: providing a second glass carrier; reserving the at least one second hole region on the second glass carrier; fabricating a second hole definition layer on the second glass carrier, the second hole definition layer overlaying the second hole region; fabricating the second substrate on the second glass carrier, the second substrate surrounds the second hole definition layer, and a thickness of the second substrate is no greater than that of the second hole definition layer, and the second substrate comprises a color filter.

In some embodiments, the step of adding liquid crystals onto the first substrate or the second substrate and aligning the first substrate with the second substrate comprises: coating the first substrate or the second substrate with a first sealant and a second sealant, the first sealant surrounds edges of the first hole region of the first substrate or edges of the second hole region of the second substrate, and the second sealant is located on an outer edge of the substrate coated with the first sealant; adding liquid crystals onto the substrate coated with the first sealant and the second sealant, the liquid crystals are located between the first sealant and the second sealant; peeling off the first hole definition layer and the second hole definition layer to expose the first hole region and the second hole region respectively; aligning the first substrate with the second substrate such that the first hole region is aligned with the second hole region; curing the first sealant and the second sealant.

In some embodiments, the step of forming a hole penetrating the first substrate and the second substrate through the first hole region and the second hole region comprises removing the first glass carrier and the second glass carrier to obtain the hole penetrating the first substrate and the second substrate.

In some embodiments, a material for the first substrate and the second substrate comprise at least one selected from a group consisting of polyimide, polyethylene terephthalate, polyethylene naphthalate and polymethylmethacrylate.

In some embodiments, the display screen is a rigid screen, and the step of preparing a first substrate and reserving at least one first hole region on the first substrate comprises: reserving the at least one first hole region on the first substrate, the first substrate comprises a thin film transistor array, the thin film transistor array not overlaying the first hole region.

In some embodiments, the step of preparing a second substrate and reserving at least one second hole region on the second substrate comprises: reserving the at least one second hole region on the second substrate, the second substrate comprises a color filter, the color filter not overlaying the second hole region.

In some embodiments, the step of adding liquid crystals onto the first substrate or the second substrate and aligning the first substrate with the second substrate comprises: coating the first substrate or the second substrate with a third sealant and a fourth sealant, the third sealant surrounds edges of the first hole region of the first substrate or edges of the second hole region of the second substrate, and is spaced from the edges of the first hole region or the edges of the second hole region by a first gap, and the fourth sealant is located on an outer edge of the substrate coated with the third sealant; coating a first protective colloid on the first substrate or the second substrate, the first protective colloid is located within the first gap and surrounds the edges of the first hole region of the first substrate or the edges of the second hole region of the second substrate; adding liquid crystals onto the substrate coated with the third sealant and the fourth sealant, the liquid crystals are located between the third sealant and the fourth sealant; aligning the first substrate with the second substrate such that the first hole region is aligned with the second hole region; curing the third sealant, the fourth sealant and the first protective colloid.

In some embodiments, the first protective colloid is spaced from the third sealant by a second gap.

In some embodiments, the step of forming a hole penetrating the first substrate and the second substrate through the first hole region and the second hole region comprises: coating a second protective colloid on a surface of the first substrate and the second substrate that have been aligned, the second protective colloid not overlaying the first hole region and the second hole region; etching the first hole region of the first substrate and the second hole region of the second substrate by using an etchant, so as to form the hole penetrating the first substrate and the second substrate, the first protective colloid and the second protective colloid are both protective colloids resisting erosion by the etchant.

In some embodiments, a base material for the first substrate and the second substrate is glass.

In some embodiments, the etchant comprises hydrofluoric acid.

Another embodiment of this disclosure provides a display screen manufactured by using the method for manufacturing a display screen as mentioned in any of the above embodiments, the display screen comprises at least one hole.

Yet another embodiment of this disclosure provides a display device comprising the display screen as mentioned in the above embodiment.

BRIEF DESCRIPTION OF DRAWINGS

In order to illustrate the technical solutions in the embodiments of this disclosure more clearly, drawings to be used in description of the embodiments of this disclosure will be briefly introduced below. Apparently, the drawings below are only some embodiments of this disclosure. For a person having ordinary skills in the art, other drawings can be further obtained from these drawings without any inventive efforts.

DETAILED DESCRIPTION OF EMBODIMENTS

The technical solutions in the embodiments of this disclosure will be described below in a clear and complete manner with reference to the drawings. The described embodiments are only some of the embodiments of the invention, instead of all of them. Based on the embodiments in this disclosure, other embodiments obtainable by a person having ordinary skills in the art fall within the scope of the disclosure.

Figure 1:
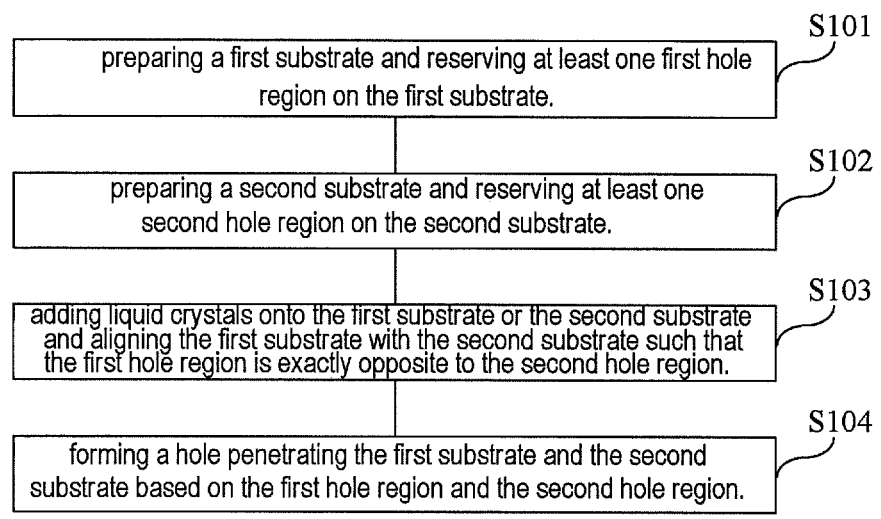
FIG. 1 is a flow chart of the method for manufacturing a display screen according to an embodiment of this disclosure.

An embodiment of the disclosure includes a method for manufacturing a display screen. As shown in FIG. 1, the method includes the following steps.

Step S101: preparing a first substrate and reserving at least one first hole region on the first substrate.

The first substrate can be an array substrate. The first hole region corresponds to a position of a function element of a product to which the display screen can be applied. For example, the function element may be but is not limited to a camera, a receiver, a HOME key, and so on.

Step S102: preparing a second substrate and reserving at least one second hole region on the second substrate.

The second substrate can be a color filter substrate. Similarly, the second hole region corresponds to a position of a certain function element of a product applying the display screen. For example, the function element can be but is not limited to a camera, a receiver, a HOME key and so on.

Step S103: adding liquid crystals onto the first substrate or the second substrate and aligning the first substrate with the second substrate such that the first hole region is aligned with the second hole region. The liquid crystals are located in a region of the first substrate other than the first hole region or in a region of the second substrate other than the second hole region, i.e., the liquid crystals do not occupy the first hole region and the second hole region. During the alignment, the substrate having no liquid crystals added can be engaged onto the substrate having liquid crystals added after being turned over, thereby avoiding spilling the liquid crystals during this procedure.

Step S104: forming a hole penetrating the first substrate and the second substrate through the first hole region and the second hole region. With this step, a hole penetrating the first substrate and the second substrate can be formed in the first hole region and the second hole region, such that a desired function element can be embedded into the hole and achieve a corresponding function through the hole. For example, a receiver allows sound to propagate to the outside through this hole.

As for the first hole region and the second hole region mentioned in the embodiment, they can be real holes penetrating the first substrate and the second substrate. Alternatively, they are not real holes, but partial regions of surfaces of the first substrate and the second substrate defined on the first substrate and the second substrate for forming a hole. With the first hole region and the second hole region, a hole penetrating the first substrate and the second substrate can be formed by adopting different technical measures. Specific depictions will be provided in the embodiments below.

According to the method for manufacturing a display screen in the embodiment of this disclosure, by reserving a first hole region and a second hole region on the first substrate and the second substrate respectively, the first hole region being aligned with the second hole region when the first substrate is aligned with the second substrate, and the liquid crystals do not occupy the first hole region and the second hole region, thus a hole can be formed through the first hole region and the second hole region, which satisfies the accuracy and reliability of boring and avoids leakage of the liquid crystals. As a result, a display screen with a hole can be manufactured and the hole will not influence the display effect, which facilitates achievement of full-screen display (with regions for forming the holes excluded) and mass production of liquid crystal panel products with holes.

Figure 2:
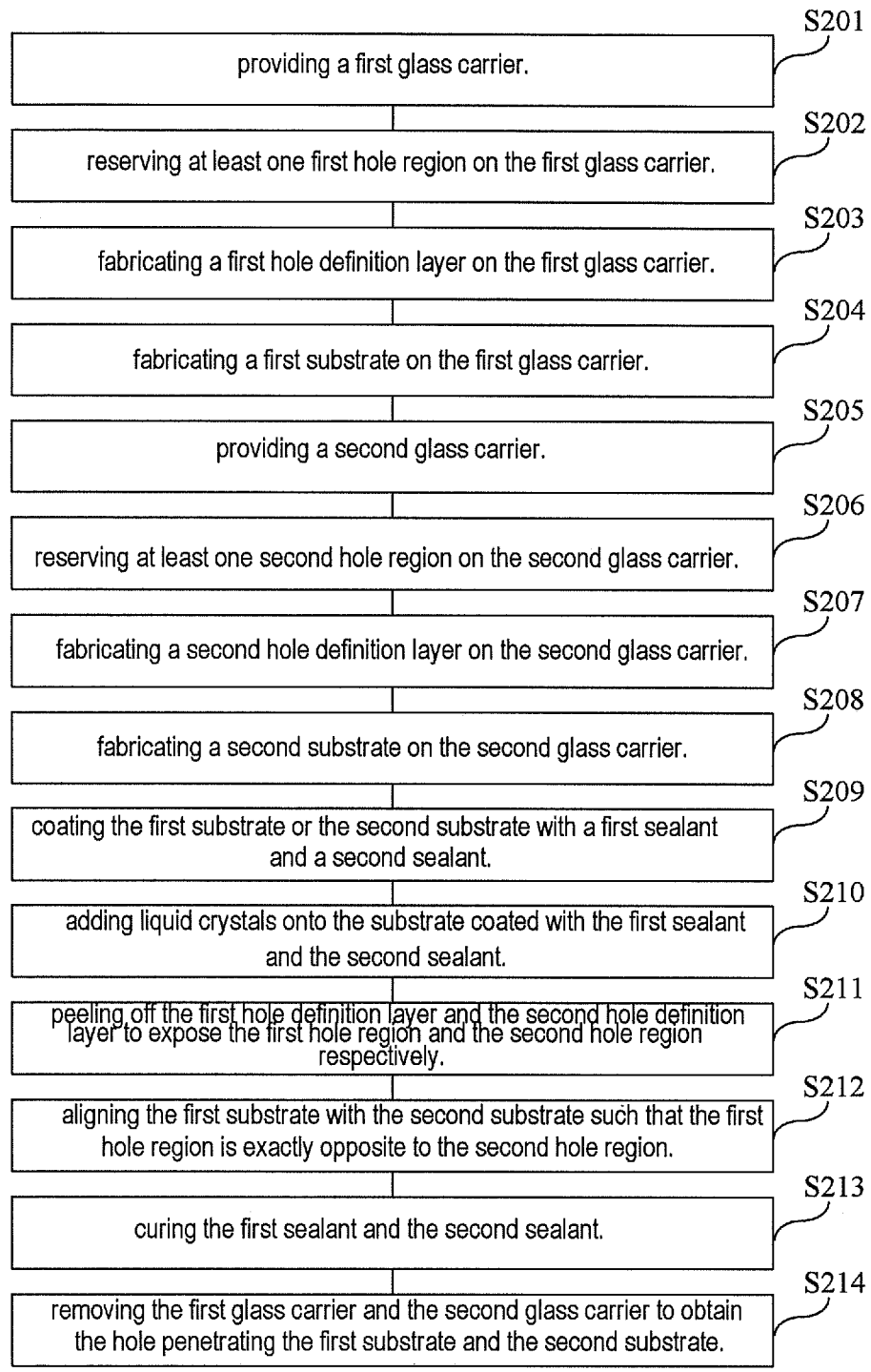
FIG. 2 is a flow chart of the method for manufacturing a display screen according to an embodiment of this disclosure.

FIG. 2 shows steps comprising the method for manufacturing a display screen according to another embodiment of this disclosure. The method can be used for manufacturing a flexible screen. As shown in FIG. 2, the method includes steps as follows.

Figure 3A:
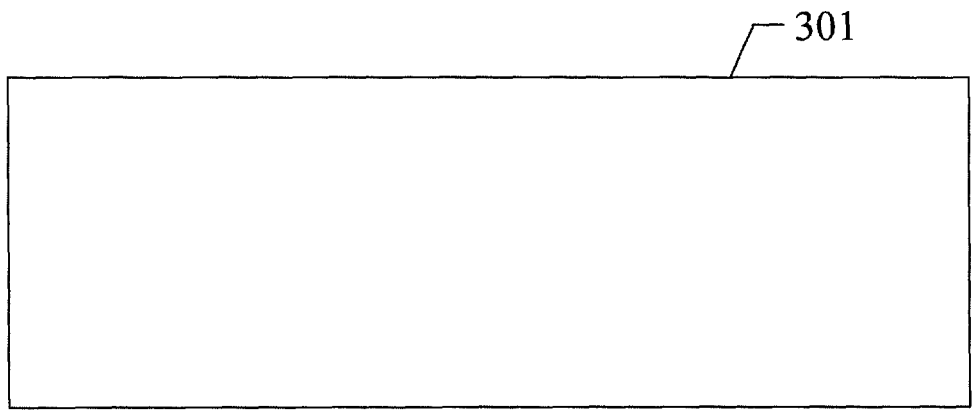
FIG. 3A to FIG. 3O are schematic structure views of the display screen in each phase of the manufacturing process according to an embodiment of this disclosure.

Step S201: providing a first glass carrier. As shown in FIG. 3A, a first glass carrier 301 is provided.

Figure 3B:
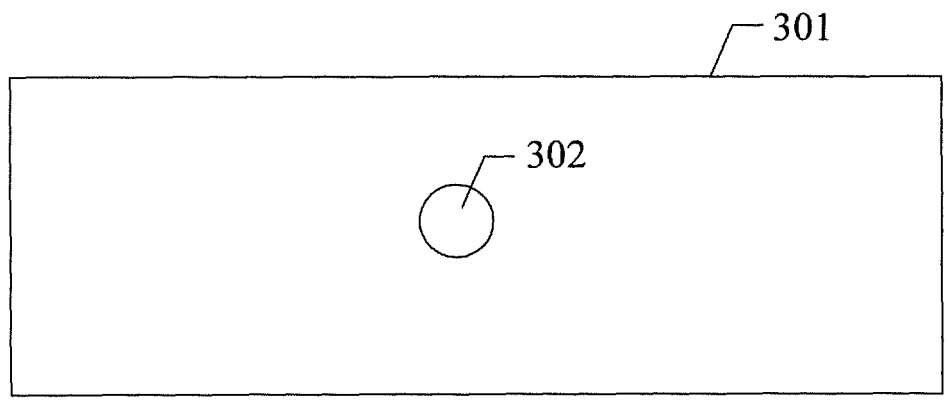

Step S202: reserving at least one first hole region on the first glass carrier. As shown in FIG. 3B, a first hole region 302 is reserved on the first glass carrier 301. The position of the first hole region 302 on the first glass carrier 301 correspond to that of a function module (e.g., including but not limited to a camera, a receiver and so on) as required in the product applying the display screen.

Figure 3C:
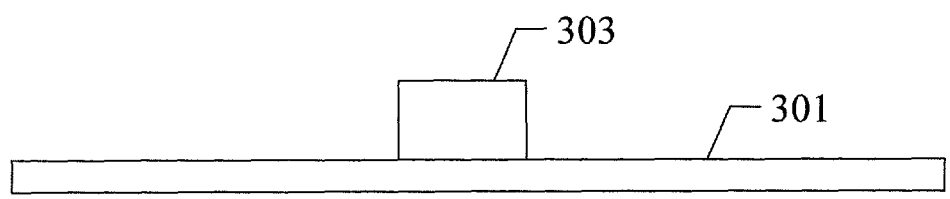

Step S203: fabricating a first hole definition layer on the first glass carrier. As shown in FIG. 3C, a first hole definition layer 303 is fabricated on the first glass carrier 301 such that the first hole definition layer 303 overlays the first hole region 302. The first hole definition layer 303 can be made of a photoresist or other materials that will not be influenced by the process for fabricating the first substrate.

Figure 3D:
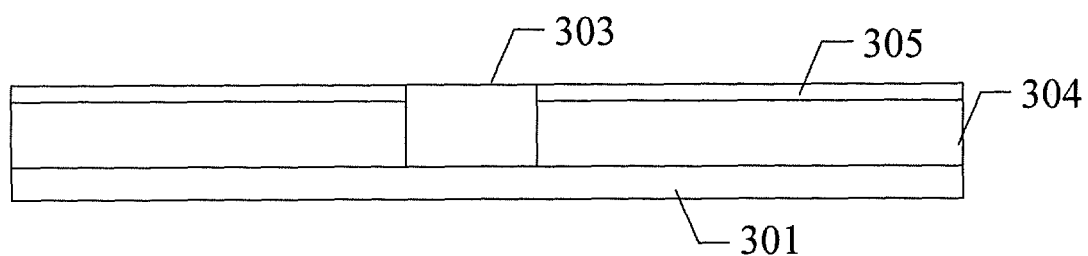

Step S204: fabricating a first substrate on the first glass carrier. As shown in FIG. 3D, the first substrate 304 surrounds the first hole definition layer 303, i.e., the first substrate 304 will not occupy the first hole region 302. The thickness of the first substrate 304 is no greater than that of the first hole definition layer 303 such that the first substrate 304 surrounds the first hole definition layer 303, thereby preventing the first substrate 304 from extending over the first hole definition layer 303.

Specifically, the first substrate 304 can be an array substrate, so the first substrate 304 can comprise a thin film transistor array 305. It should be understood that, in addition to fabricating the thin film transistor array 305, other processes can also be carried out on the first substrate 304 so as to fabricate other structures required for the array substrate. The other structures and processes are known for those skilled in the art, which will not be described herein for simplicity. The thin film transistor array 305 is disposed on the first substrate 304, it will not extend over the first hole definition layer 303.

In the case where the display screen is a flexible screen, the material of the first substrate 304 comprises at least one selected from the group consist of polyimide, polyethylene terephthalate, polyethylene naphthalate and polymethylmethacrylate. For example, if polyimide is used for forming the first substrate 304, it can be coated to the first glass carrier 301 and then dried such that the polyimide material is cured to form a film.

Figure 3E:
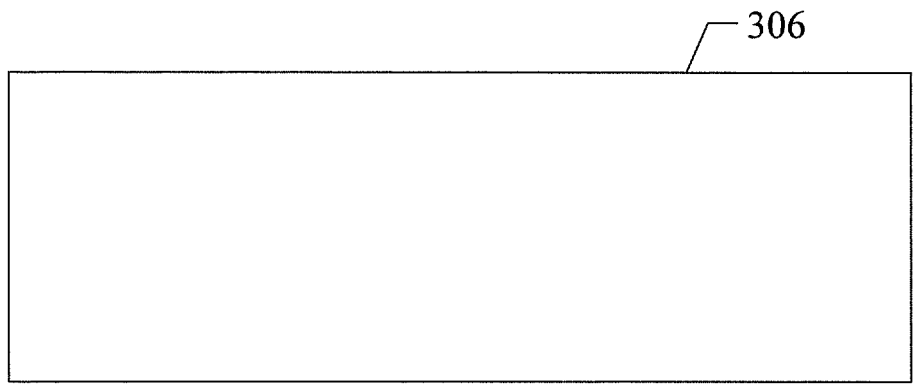

Step S205: providing a second glass carrier. As shown in FIG. 3E, a second glass carrier 306 is provided.

Figure 3F:
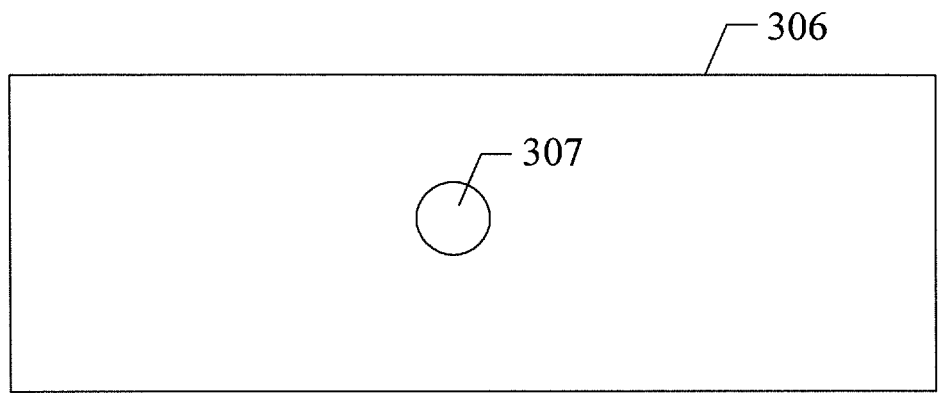

Step S206: reserving at least one second hole region on the second glass carrier. As shown in FIG. 3F, a second hole region 307 is reserved on the second glass carrier 306. The position of the second hole region 307 on the second glass carrier 306 corresponds to that of a function module (e.g., including but not limited to a camera, a receiver and so on) as required in the product applying the display screen. The second hole region 307 corresponds to the first hole region 302 of the first glass carrier.

Figure 3G:
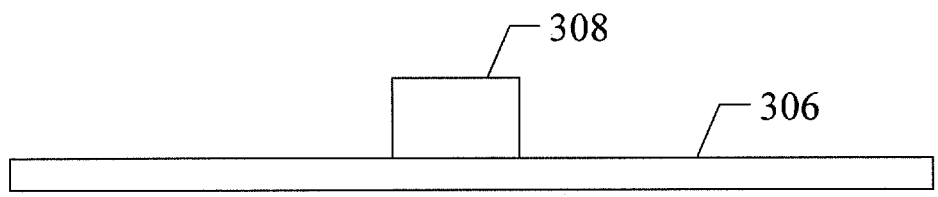

Step S207: fabricating a second hole definition layer on the second glass carrier. As shown in FIG. 3G, a second hole definition layer 308 is manufactured on the second glass carrier 306 such that the second hole definition layer 308 overlays the second hole region 307. The second hole definition layer 308 can be made of a photoresist or other materials that will not be influenced by the process for manufacturing the second substrate.

Figure 3H:
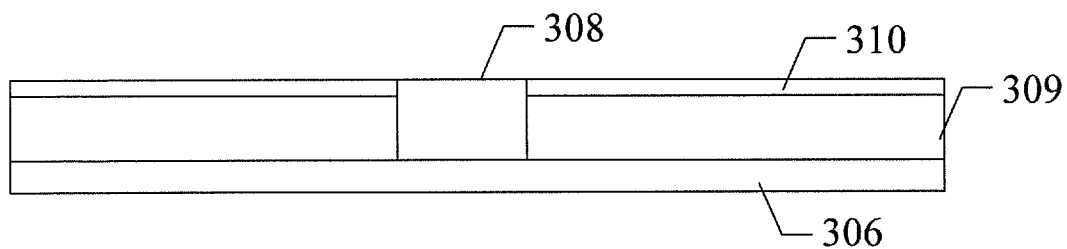

Step S208: fabricating a second substrate on the second glass carrier. As shown in FIG. 3H, the second substrate 309 surrounds the second hole definition layer 308, i.e., the second substrate 309 will not occupy the second hole region 307. The thickness of the second substrate 309 is no greater than that of the second hole definition layer 308 such that the second substrate 309 surrounds the second hole definition layer 308, thereby preventing the second substrate 309 from extending over the second hole definition layer 308.

Specifically, the second substrate 309 can be a color filter substrate, so the second substrate 309 can comprise a color filter 310. The process for manufacturing the color filter 310 comprises manufacturing a color resistance and a black matrix, and so on. It should be understood that, in addition to manufacturing a color filter 310, other processes required for a color filter substrate can also be carried out on the second substrate 309. The processes are known for those skilled in the art, which will not be described herein for simplicity. The color filter 310 is disposed on the second substrate 309, it will not extend over the second hole definition layer 308.

In the case where the display screen is a flexible screen, the material of the second substrate 309 comprises at least one selected from the group consisting of polyimide, polyethylene terephthalate, polyethylene naphthalate and polymethylmethacrylate. For example, if polyimide is used for forming the second substrate 309, it can be coated to the second glass carrier 306 and then dried such that the polyimide material is cured to form a film.

Figure 3I:
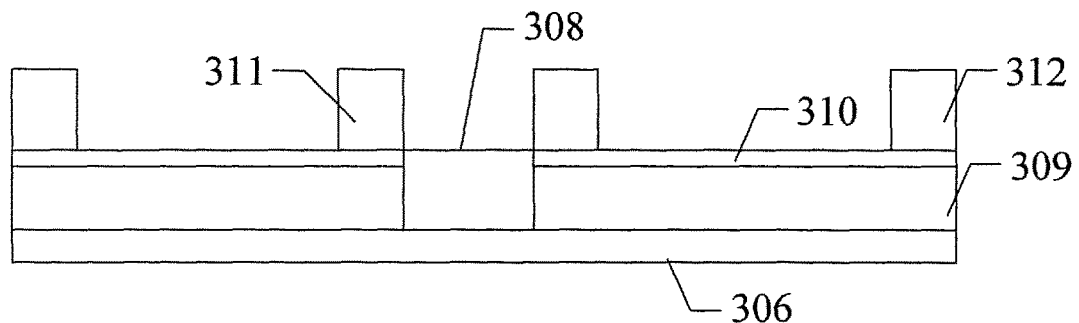

Step S209: coating the first substrate or the second substrate with a first sealant and a second sealant. In an embodiment, as shown in FIG. 3I, the first sealant 311 and the second sealant 312 are coated to the second substrate 309.

It should be understood that the first sealant 311 can be coated to either the first substrate 304 or the second substrate 309. Specifically, if the first sealant 311 is coated to the first substrate 304, the first sealant 311 surrounds edges of the first hole definition layer of the first substrate 304. In other words, the first sealant 311 is located on the thin film transistor array 305 and surrounds a region of the first substrate 304 corresponding to the first hole region. Alternatively, if the first sealant 311 is coated to the second substrate 309, the first sealant 311 surrounds edges of the second hole definition layer of the second substrate 309. In other words, the first sealant 311 is located on the color filter layer 310 and surrounds a region of the second substrate 309 corresponding to the second hole region. In this way, the first sealant 311 will not occupy the hole regions, but prevent liquid crystals added in the subsequent steps from entering the hole regions. The second sealant 312 and the first sealant 311 are located on the same substrate, i.e., if the first sealant 311 is coated to the first substrate 304, the second sealant 312 is also coated to the first substrate 304; if the first sealant 311 is coated to the second substrate 309, the second sealant 312 is also coated to the second substrate 309. The second sealant 312 is arranged along an outer edge of the first substrate or the second substrate. In an embodiment, the first sealant and the second sealant can be both UV (ultraviolet) glue.

Therefore, with this step, the first sealant 311 surrounding the first hole definition layer and the second sealant 312 located on the outer edge of the substrate can form an enclosed region on the substrate, and liquid crystals can be added into this region, which avoids leakage of the liquid crystals.

Step S210: adding liquid crystals onto the substrate coated with the first sealant and the second sealant.

Figure 3J:
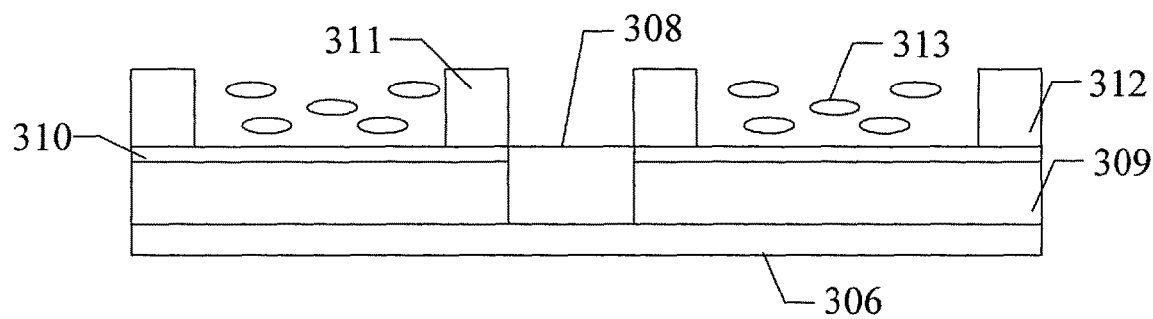

As shown in FIG. 3J, in this embodiment, liquid crystals 313 are added into a region of the second substrate 309 located between the first sealant 311 and the second sealant 312. It should be understood that if the first sealant 311 and the second sealant 312 are coated to the first substrate 304, the liquid crystals 313 will be added onto the first substrate 304. The liquid crystals 313 are located in a region between the first sealant 311 and the second sealant 312, which can prevent the liquid crystals 313 from flowing into other regions.

Figure 3K:
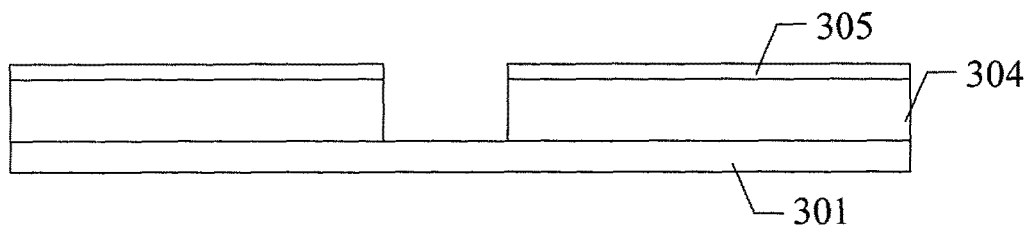
Figure 3L:
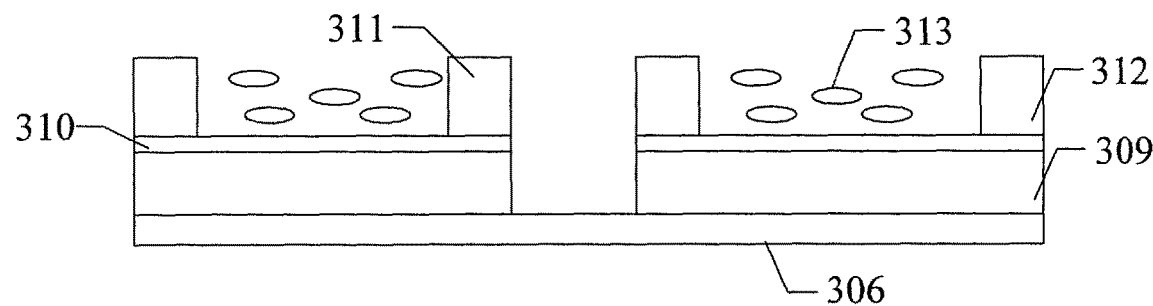

Step S211: peeling off the first hole definition layer and the second hole definition layer to expose the first hole region and the second hole region respectively. As shown in FIG. 3K, when the first hole definition layer 303 is peeled off, the first hole region 302 of the first glass carrier can be exposed and a hole is formed in the first substrate 304. Similarly, as shown in FIG. 3L, when the second hole definition layer 308 is peeled off, the second hole region 307 of the first glass carrier can be exposed and a hole is formed in the second substrate 309.

Figure 3M:
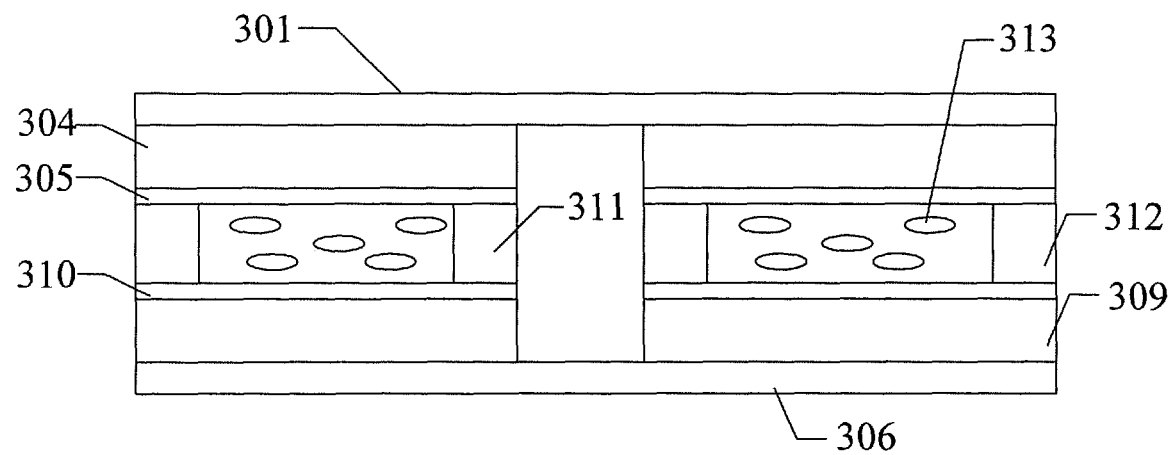

Step S212: aligning the first substrate with the second substrate such that the first hole region is aligned with the second hole region. As shown in FIG. 3M, in this embodiment, the first substrate 304 is engaged onto the second substrate 309 after being turned over, such that the first hole region 302 is aligned with the second hole region 307. Specifically, the first substrate 304 and the second substrate 309 can be positioned by using spacers thereon.

Therefore, with this step, the substrate having no liquid crystals 313 added is engaged onto the substrate having liquid crystals 313 added after being turned over, thereby avoiding spilling the liquid crystals 313.

Step S213: curing the first sealant and the second sealant. Specifically, the first sealant 311 and the second sealant 312 may be cured by UV irradiation, which avoids leakage of the liquid crystals 313 caused by cracking of the first sealant 311 and the second sealant 312.

Figure 3N:
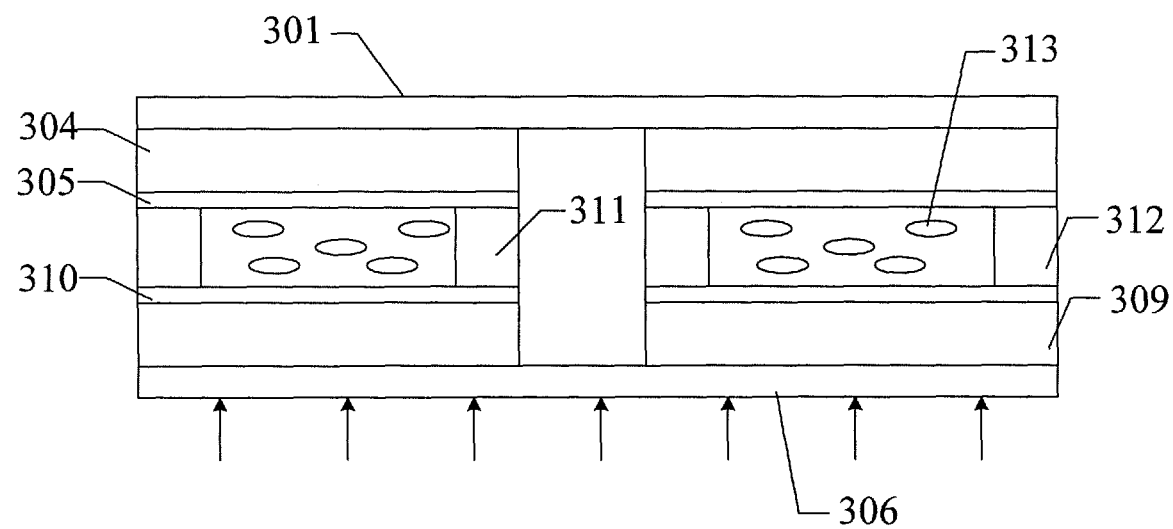

Step S214: removing the first glass carrier and the second glass carrier to obtain a hole penetrating the first substrate and the second substrate. As shown in FIG. 3N, the first glass carrier 301 may be absorbed by means of vacuum absorption and the second glass carrier 306 is irradiated with UV light, such that the second substrate 309 is separated from the second glass carrier 306. The first substrate and the second substrate are turned over as a whole, and the first glass carrier 301 is irradiated with UV light such that the first substrate 304 is separated from the first glass carrier 301.

Figure 3O:
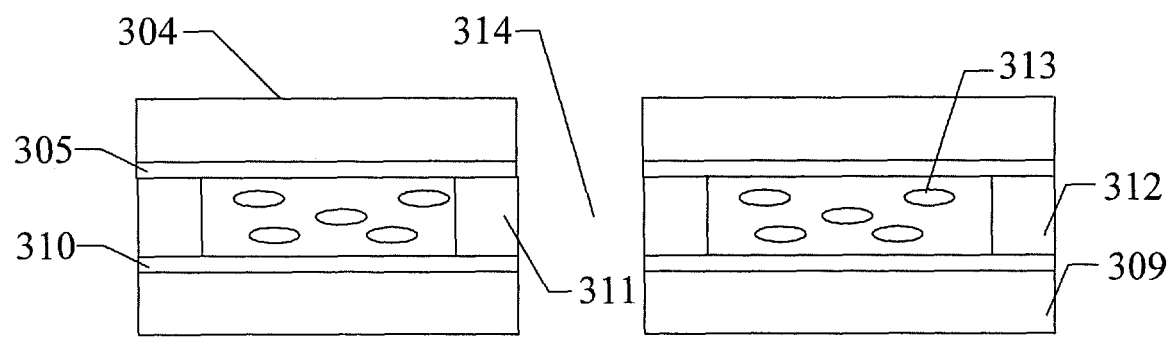

With the above procedures, as shown in FIG. 3O, after the first glass carrier 301 and the second glass carrier 306 are removed, a hole penetrating the first substrate and the second substrate are formed, the hole corresponding to the first hole region 302 and the second hole region 307.

It should be understood that the first hole region of the first glass carrier and the second hole region of the second glass carrier mentioned above can be actual holes formed in the first glass carrier and the second glass carrier. Alternatively, they are not real holes, but partial regions of surfaces of the first glass carrier and the second glass carrier defined on the first glass carrier and the second glass carrier for forming the hole.

To sum up, according to the method for manufacturing a display screen provided in the embodiment of this disclosure, a hole is formed in a flexible screen by integrating the manufacturing process of a flexible screen device with the assembling process for a liquid crystal display. In this method, the hole regions reserved on the glass carriers correspond to the holes finally formed, and the reserved hole regions can be designed in accordance with sizes and shapes of the hole required such that the obtained hole fit a desired function element, which brings good compatibility to the method. According to the method for manufacturing a display screen provided in the embodiments of this disclosure, it is unnecessary to mechanically bore holes in the substrate, which avoids problems such as damages and dimension errors, and satisfies the accuracy and reliability of the formed hole. In particular, it facilitates the manufacture of microholes, and thus further solves the problem about difficulties of manufacturing microholes in partial regions of a display screen of a liquid crystal display. Moreover, it facilitates achievement of full-screen display (with regions for forming the holes excluded) without affecting the thin film transistor array, the color filter and the wiring on the periphery of the holes, and also facilitates mass production of liquid crystal panel products with holes.

Figure 4:
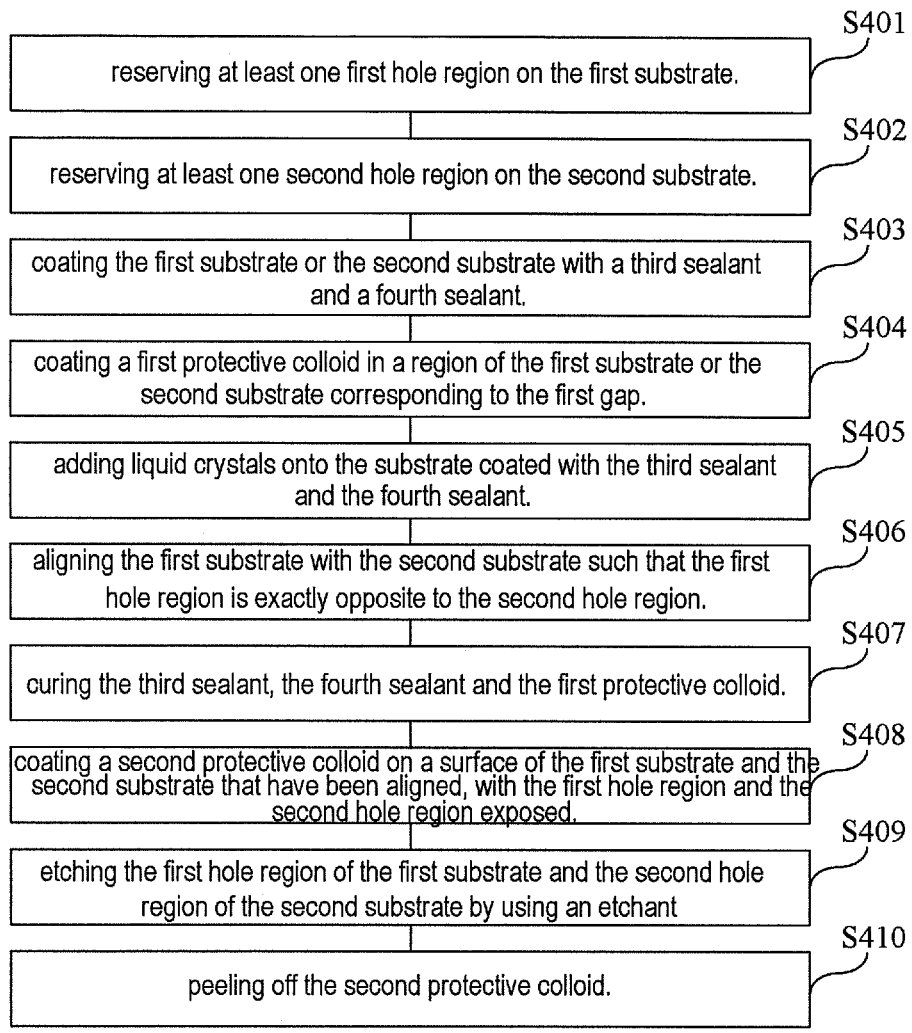
FIG. 4 is a flow chart of the method for manufacturing a display screen according to an embodiment of this disclosure.

The method for manufacturing a display screen according to another embodiment of this disclosure as shown in FIG. 4 comprises steps as follows, which method can be used for manufacturing a rigid screen.

Figure 5A:
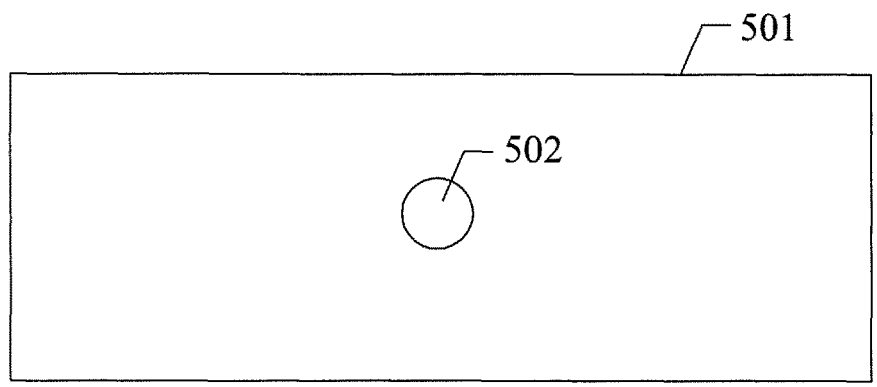
FIG. 5A to FIG. 5J are schematic structure views of the display screen in each phase of the manufacturing process according to an embodiment of this disclosure.

Step S401: reserving at least one first hole region on the first substrate. As shown in FIG. 5A, at least one first hole region 502 is reserved on the first substrate 501. It should be understood that, the first hole region 502 in this step is only a region reserved on the first substrate 501 for forming a hole in the future, instead of boring a hole in the first substrate 501.

Figure 5B:
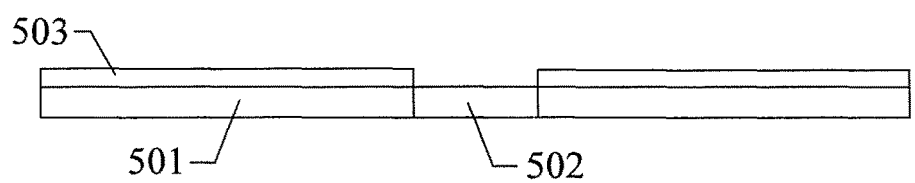

Specifically, the first substrate 501 can be an array substrate, so the first substrate 501 comprises a thin film transistor array 503. The thin film transistor array 503 is located in a region other than the first hole region 502, as shown in FIG. 5B. The material for the base of the first substrate 501 can be glass.

Figure 5C:
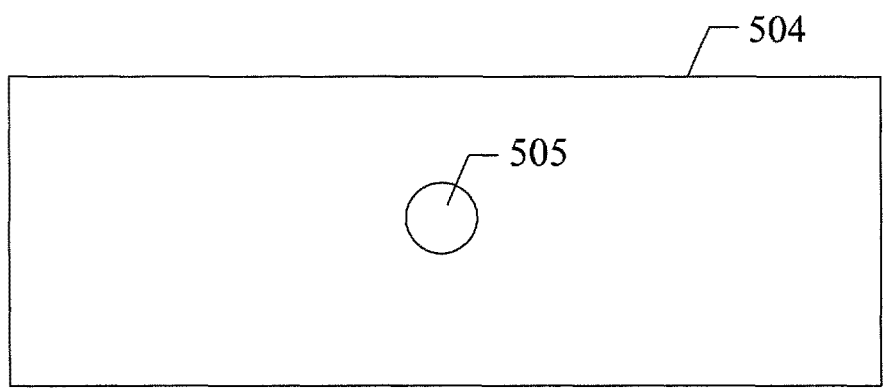

Step S402: reserving at least one second hole region on the second substrate. As shown in FIG. 5C, at least one second hole region 505 is reserved on the second substrate 504. It should be understood that, the second hole region 505 in this step is only a region reserved on the second substrate 504 for forming a hole in the future, instead of boring a hole in the second substrate 504.

Figure 5D:
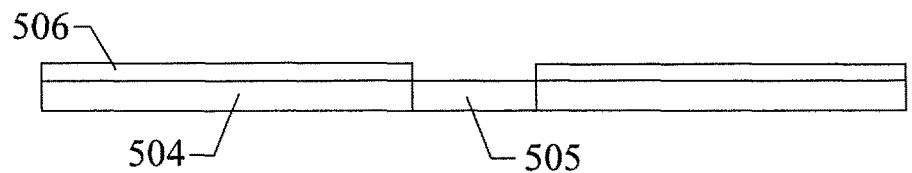

Specifically, the second substrate 504 can be a color filter substrate, so the second substrate 504 comprises a color filter 506. The color filter 506 is located in a region other than the second hole region 505, as shown in FIG. 5D. The material for the base of the second substrate 504 can be glass.

Figure 5E:
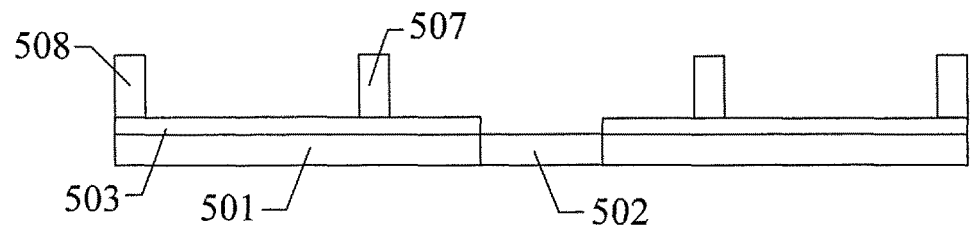

Step S403: coating the first substrate or the second substrate with a third sealant and a fourth sealant. In an embodiment, as shown in FIG. 5E, the third sealant 507 and the fourth sealant 508 are coated onto the first substrate 501.

It should be understood that the third sealant 507 can be coated to either the first substrate 501 or the second substrate 504. Specifically, in case the third sealant 507 is coated to the first substrate 501, the third sealant 507 surrounds edges of the first hole region 502 of the first substrate 501 and is spaced from the edges of the first hole region 502 by a first gap. Alternatively, if the third sealant 507 is coated to the second substrate 504, the third sealant 507 surrounds edges of the second hole region 505 of the second substrate 504 and is spaced from the edges of the second hole region 505 by a first gap. The first gap is provided for filling with a first protective colloid in a subsequent step. The third sealant 507 is arranged on the periphery of the hole regions without occluding the hole regions and can prevent liquid crystals added in the subsequent steps from entering the hole regions. The fourth sealant 508 and the third sealant 507 are located on the same substrate, i.e., if the third sealant 507 is coated to the first substrate 501, the fourth sealant 508 is also coated to the first substrate 501; if the third sealant 507 is coated to the second substrate 504, the fourth sealant 508 is also coated to the second substrate 504. The fourth sealant 508 is arranged along an outer edge of the first substrate or the second substrate coated with the third sealant. In an embodiment, the third sealant and the fourth sealant can be both UV glue.

Therefore, with this step, the third sealant 507 and the fourth sealant 508 can form an enclosed region on the substrate where they are located, and liquid crystals can be added into this region conveniently, which avoids leakage of the liquid crystals.

Step S404: coating a first protective colloid in a region of the first substrate or the second substrate corresponding to the first gap.

Figure 5F:
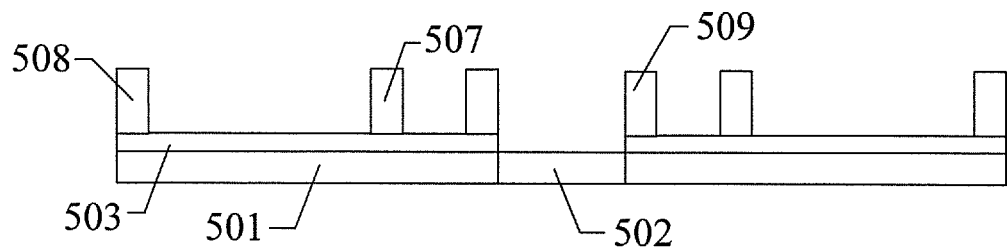

As shown in FIG. 5F, in an embodiment, a first protective colloid 509 is coated in a region of the first gap of the first substrate 501, and the first protective colloid 509 surrounds edges of the first hole region 502.

It should be understood that the first protective colloid 509 can be coated to the first substrate 501 and surround edges of the first hole region 502; alternatively, the first protective colloid 509 can be coated to the second substrate 504 and surround edges of the second hole region 505.

Specifically, if the first protective colloid 509 is to be coated on the substrate coated with the third sealant 507 and the fourth sealant 508, the first protective colloid is coated in a region where the first gap is located. If the first protective colloid 509 is to be coated on the substrate not coated with the third sealant 507 and the fourth sealant 508, the first protective colloid is coated in a region of the substrate corresponding to the first gap. The first protective colloid 509 can be either next to the edges of the hole regions, or spaced therefrom.

During the process of curing the first protective colloid 509, it may damage the third sealant 507 that has been cured, so in an embodiment, the first protective colloid 509 is spaced from the third sealant 507 by a second gap, which can weaken the damage of the curing process for the first protective colloid to the third sealant 507 and avoid leakage of the liquid crystals.

In a subsequent step, the first hole region 502 of the first substrate 501 and the second hole region 505 of the second substrate 504 may be etched by using an etchant such as hydrofluoric acid, so the first protective colloid 509 is a protective colloid against erosion of the hydrofluoric acid, which protects the third sealant 507 against erosion of the hydrofluoric acid and avoids leakage of the liquid crystals. For example, the first protective colloid 509 can be frit that can be melt and solidified. Besides, the first protective colloid 509 can further achieve the function of enhancing the mechanical structure of the hole regions.

Step S405: adding liquid crystals onto the substrate coated with the third sealant and the fourth sealant.

Figure 5G:
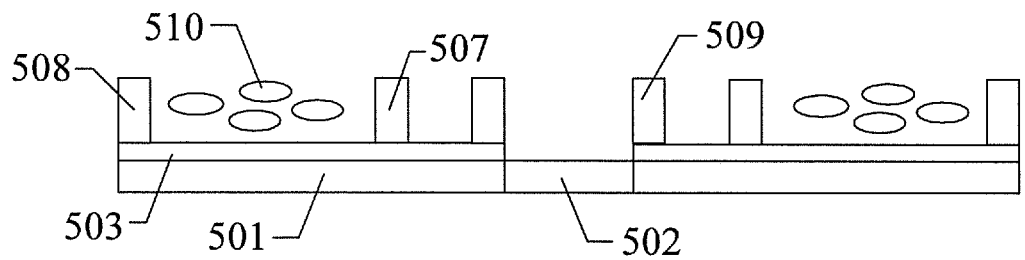

As shown in FIG. 5G, liquid crystals 510 are added into a region of the first substrate 501 between the third sealant 507 and the fourth sealant 508.

With this step, the liquid crystals 510 are located in a region between the third sealant 507 and the fourth sealant 508, which can prevent the liquid crystals 510 from flowing into the hole regions or flowing away from an outer edge of the substrate on which it is located.

Figure 5H:
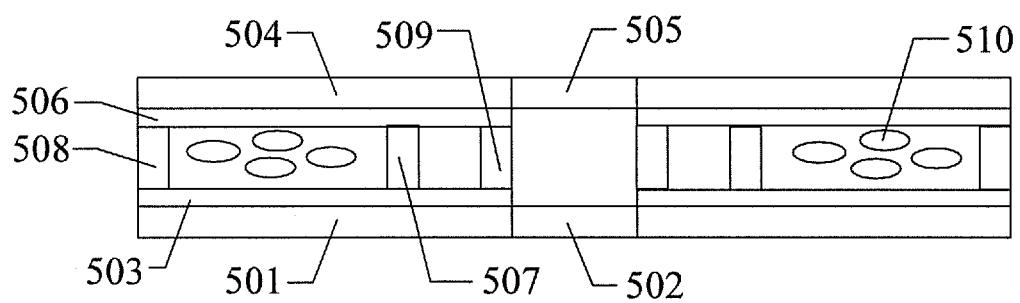

Step S406: aligning the first substrate with the second substrate such that the first hole region is aligned with the second hole region. As shown in FIG. 5H, the second substrate 504 is engaged onto the first substrate 501 after being turned over such that the first hole region 502 is aligned with the second hole region 505.

With this step, the substrate having no liquid crystals 510 added is engaged onto the substrate having liquid crystals 510 added after being turned over, thereby avoiding spilling the liquid crystals 510.

Step S407: curing the third sealant, the fourth sealant and the first protective colloid.

Specifically, the third sealant 507 and the fourth sealant 508 can be cured by UV irradiation, which avoids leakage of the liquid crystals 510 caused by cracking of the first sealant 507 and the second sealant 508. Then, the first protective colloid 509 is cured at a curing temperature of 350~450° C.

Step S408: coating a second protective colloid on surfaces of the first substrate and the second substrate that have been aligned, with the first hole region and the second hole region exposed.

Figure 5I:
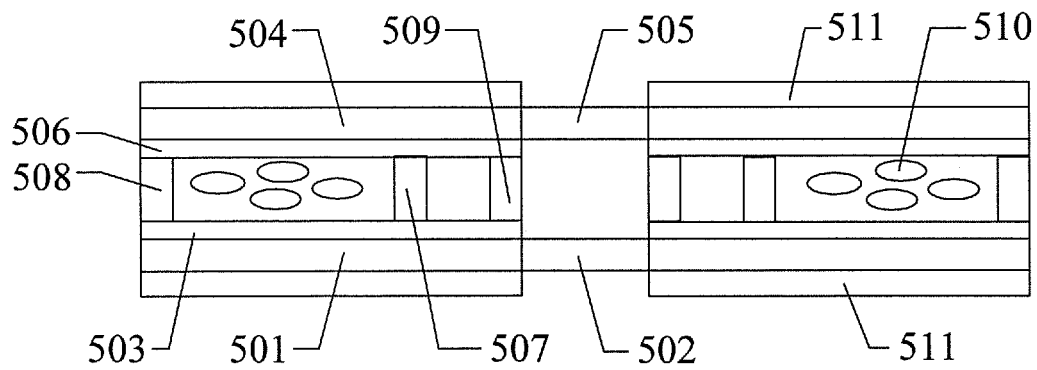

As shown in FIG. 5I, a second protective colloid 511 is coated on surfaces of the first substrate 501 and the second substrate 504. The second protective colloid 511 does not overlay the first hole region 502 and the second hole region 505 such that the first hole region 502 and the second hole region 505 can be etched in a subsequent step.

In the subsequent step, the first hole region 502 of the first substrate 501 and the second hole region 505 of the second substrate 504 are etched by using an etchant such as hydrofluoric acid, so the second protective colloid 511 is a protective colloid against erosion of the hydrofluoric acid. For example, the second protective colloid 511 is photoresist.

Step S409: etching the first hole region and the second hole region of the first substrate and the second substrate that have been aligned by using an etchant such as hydrofluoric acid to form a hole penetrating the first substrate and the second substrate.

Figure 5J:
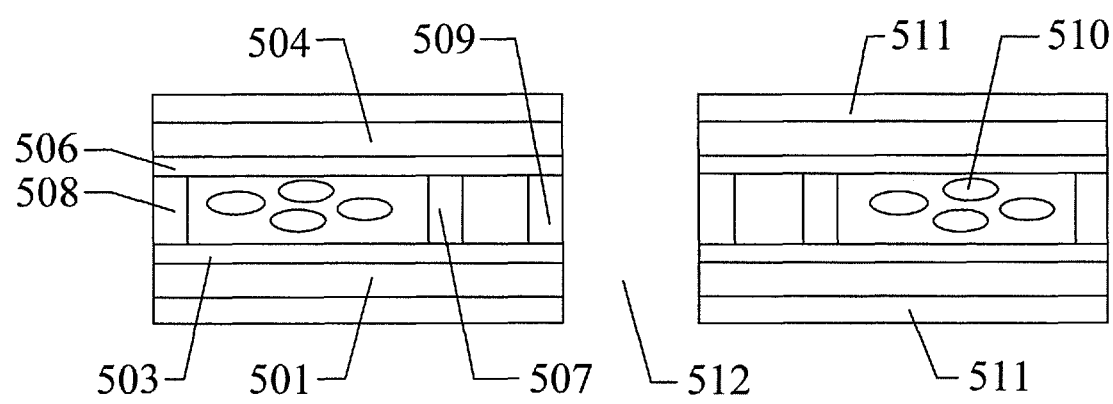

In an embodiment, as shown in FIG. 5J, the first substrate 501 and the second substrate 504 that have been aligned are placed into a tank with hydrofluoric acid for erosion. The hydrofluoric acid erodes the first hole region 502 and the second hole region 505 which are not protected by the second protective colloid 511, thereby forming a penetrating hole 512. Other regions of the first substrate 501 and the second substrate 504 will not be eroded by the hydrofluoric acid because of the protection of the first protective colloid 509 and the second protective colloid 511.

Step S410: peeling off the second protective colloid. After the second protective colloid 511 is peeled off, the manufacture of the display screen is accomplished. The display screen has a hole 512.

Although the etchant herein for etching the first hole region and the second hole region is hydrofluoric acid, the invention is not limited thereto, and in actual production, other suitable etchants can be adopted based on the materials for the first substrate and the second substrate.

To sum up, according to the method for manufacturing a display screen provided in the embodiments of the disclosure, a technical effect of forming holes in a rigid screen is achieved by integrating the boring process for a rigid glass screen with the manufacturing process of a display device; besides, the method allows simultaneous formation of a plurality of holes in a large piece of glass, so the production efficiency is high. The method protects regions other than the hole regions reserved on the first substrate and the second substrate against erosion and the etchant only etches the reserved hole regions to form holes, so the hole regions can be designed in accordance with sizes and shapes of the holes required such that the obtained holes fit desired function elements, which brings good compatibility to the method. According to the method provided in the embodiments, it is unnecessary to mechanically bore holes in the substrate, which avoids problems such as damages and dimension errors and satisfies the accuracy and reliability of the boring. In particular, it facilitates the manufacture of microholes, and thus further solves the technical problem about difficulties in manufacturing microholes in local regions of a display screen of a mobile terminal for instance. Moreover, it facilitates achievement of full-screen display (with regions for forming through holes excluded) without influencing the thin film transistor array, the color filter and the wiring on the periphery of the holes, and also facilitates mass production of mobile terminal liquid crystal panel products with holes.

Another embodiment of this disclosure discloses a display screen. The display screen is manufactured by using the method for manufacturing a display screen as mentioned in any of the above embodiments. The display screen manufactured by using the above method has at least one hole. Examples of the structure of the display screen are shown in FIG. 3O or FIG. 5J. See the above embodiments for details, which will not be repeated herein for simplicity.

With highly accurate holes, the display screen facilitates achievement of full-screen display of a display device (with regions for forming the holes excluded) without influencing the thin film transistor array, the color filter and the wiring on the periphery of the holes, and also facilitates application of the display screen to mass production of liquid crystal panel products with holes.

Yet another embodiment of the disclosure discloses a display device. The display device comprises the display screen as mentioned in the above embodiment. The structure of the display screen will not be repeated herein for simplicity. Specifically, the display device can be any product or component having a display function, such as a liquid crystal display panel, electronic paper, an OLED panel, a cellphone, a tablet computer, a television, a display, a notebook computer, a digital photo frame, a navigator or the like.

The embodiments in the description are described in a progressive manner, and what each embodiment emphasizes is a difference of the embodiment from the others, and for the same or similar portions between the embodiments, they can refer to each other.

Although part of the embodiments of the invention have been described, those skilled in the art can make further variations and modifications to these embodiments once they know the basic inventive concept revealed in this disclosure. Therefore, the appended claims should be construed as including these embodiments and all variations and modifications falling within the spirits and scopes of the invention.

Finally, it should be noted that relational terms such as "first" and "second" are only used for distinguishing one entity or operation from another entity or operation, and they do not necessarily require or imply the presence of any of such actual relations or sequences between the entities or operations. Moreover, terms of "comprise", "include" or any other variant are intended to mean a non-exclusive inclusion such that a process, a method, an article or a terminal device comprising a series of elements comprises not only these elements, but also other elements not listed explicitly; or, it further comprises elements inherent to the process, the method, the article or the terminal device. Unless otherwise indicated, an item such as a process, a method, an article or a terminal device comprising an element defined by wording "comprising a/an . . . " does not exclude the presence of further same elements in this item.

What have been stated above are only some embodiments of the invention, but the scope of the invention shall not be limited thereto. Any variation or substitution easily conceivable within the scope disclosed in this disclosure for a skilled person who is familiar with this technical field shall fall within the scope of the invention. Therefore, the scope of the invention shall be subject to the scope of the appended claims.

What is claimed is:

1. A method for manufacturing a display screen, comprising:
   preparing a first substrate and reserving at least one first hole region on the first substrate, the first hole region not penetrating the first substrate;
   preparing a second substrate and reserving at least one second hole region on the second substrate, the second hole region not penetrating the second substrate;
   adding liquid crystals onto the first substrate or the second substrate, and aligning the first substrate with the second substrate such that the first hole region is aligned with the second hole region to form a cavity, wherein the liquid crystals do not occupy the first hole region or the second hole region; and
   forming a hole penetrating the first substrate and the second substrate based on the cavity,
   wherein the adding liquid crystals onto the first substrate or the second substrate and aligning the first substrate with the second substrate comprises:
   coating the first substrate or the second substrate with a third sealant and a fourth sealant, wherein the third sealant surrounds edges of the first hole region of the first substrate or edges of the second hole region of the second substrate, and is spaced from the edges of the first hole region or the edges of the second hole region by a first gap, and the fourth sealant is located on an outer edge of the substrate coated with the third sealant;
   coating a first protective colloid on the first substrate or the second substrate, wherein the first protective colloid is located within the first gap and surrounds the edges of the first hole region of the first substrate or the edges of the second hole region of the second substrate;
   adding liquid crystals onto the substrate coated with the third sealant and the fourth sealant, wherein the liquid crystals are located between the third sealant and the fourth sealant;
   aligning the first substrate with the second substrate such that the first hole region is aligned with the second hole region; and
   curing the third sealant, the fourth sealant and the first protective colloid;
   wherein the forming the hole penetrating the first substrate and the second substrate based on the cavity comprises:
   coating a second protective colloid on a surface of the first substrate and the second substrate that have been aligned, the second protective colloid not overlaying the first hole region or the second hole region; and
   etching the first hole region of the first substrate and the second hole region of the second substrate by using an etchant, so as to form the hole penetrating the first substrate and the second substrate, wherein the first protective colloid and the second protective colloid are both protective colloids resisting erosion by the etchant.

2. The method according to claim 1, wherein the second substrate comprises a color filter, and wherein the color filter does not overlay the second hole region.

3. The method according to claim 1, wherein the first protective colloid is spaced from the third sealant by a second gap.

4. The method according to claim 1, wherein a base material for the first substrate and the second substrate is glass.

5. The method according to claim 1, wherein the etchant comprises hydrofluoric acid.

* * * * *